(12) United States Patent
Satoh et al.

(10) Patent No.: US 8,174,172 B2
(45) Date of Patent: May 8, 2012

(54) PIEZOELECTRIC RESONATOR PLATE, AND PIEZOELECTRIC RESONATOR DEVICE

(75) Inventors: Syunsuke Satoh, Kakogawa (JP); Shinichi Koyama, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 0 days.

(21) Appl. No.: 13/085,588

(22) Filed: Apr. 13, 2011

(65) Prior Publication Data

US 2011/0187236 A1     Aug. 4, 2011

Related U.S. Application Data

(62) Division of application No. 12/092,127, filed on Apr. 30, 2008, now Pat. No. 7,948,156.

(30) Foreign Application Priority Data

Dec. 21, 2005  (JP) ................................. 2005-368524
Sep. 1, 2006   (JP) ................................. 2006-238093

(51) Int. Cl.
  *H01L 41/09*  (2006.01)
  *H03H 9/21*   (2006.01)
(52) U.S. Cl. .......................... 310/370; 310/365; 310/367
(58) Field of Classification Search .................. 310/365, 310/367, 370
See application file for complete search history.

(56) References Cited

U.S. PATENT DOCUMENTS

| | | | | |
|---|---|---|---|---|
| 6,133,673 A * | 10/2000 | Kawara et al. | ................. | 310/320 |
| 6,333,591 B1 * | 12/2001 | Yoshio et al. | ................. | 310/367 |
| 6,992,424 B2 * | 1/2006 | Sasaki et al. | ................. | 310/360 |
| 7,397,172 B2 * | 7/2008 | Kikushima | ................. | 310/370 |
| 7,872,404 B2 * | 1/2011 | Numata et al. | ................. | 310/370 |
| 2005/0140252 A1 * | 6/2005 | Miyata et al. | ................. | 310/370 |

FOREIGN PATENT DOCUMENTS

JP     2000-278079    *   6/2000
JP     2007-013719 A  *   1/2007

* cited by examiner

*Primary Examiner* — Thomas Dougherty
(74) *Attorney, Agent, or Firm* — Marvin A. Motsenbocker; Mots Law, PLLC

(57) ABSTRACT

A piezoelectric resonator device comprises a piezoelectric resonator plate, a base for holding the piezoelectric resonator plate, a lid for hermetically enclosing the piezoelectric resonator plate held on the base, and a support member made of a brittle material for reducing external stress to the piezoelectric resonator plate. The piezoelectric resonator plate is held on the base via a support member. In this case, the base, the piezoelectric resonator plate, and the support member are bonded with each other using a base bonding member and a piezoelectric resonator plate bonding member (connection bumps) by FCB using ultrasonic waves. The base is electrically and mechanically bonded with the support member via the base bonding member in a plurality of areas of the support member using ultrasonic waves. Also, the piezoelectric resonator plate is electrically and mechanically bonded with the support member via the piezoelectric resonator plate bonding member in an area of the piezoelectric resonator plate using ultrasonic waves.

2 Claims, 11 Drawing Sheets

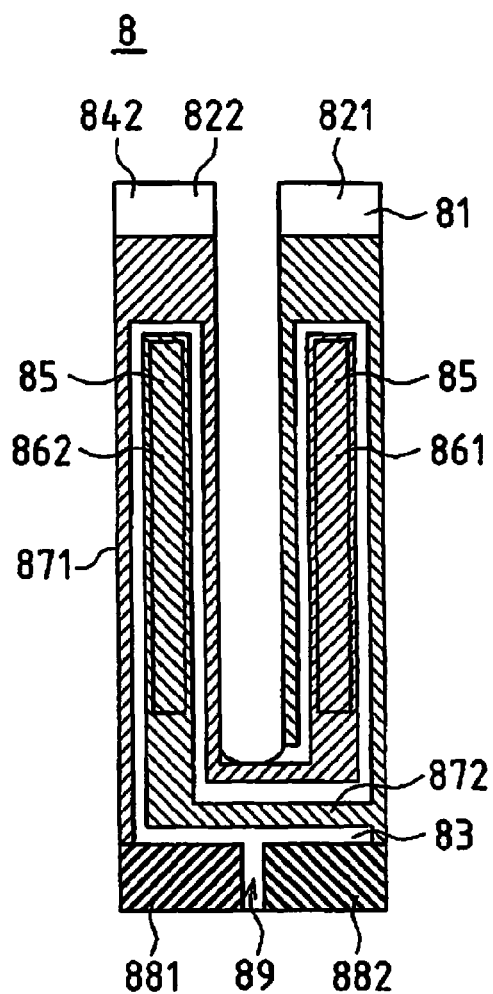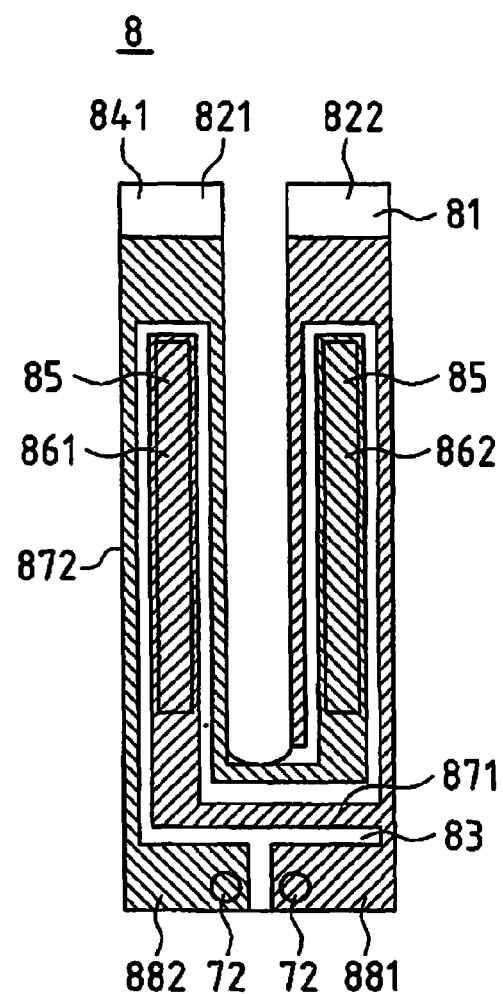
FIG.9 (a)  FIG.9 (b)

PIEZOELECTRIC RESONATOR PLATE, AND PIEZOELECTRIC RESONATOR DEVICE

This application is a division of application Ser. No. 12/092,127 filed on Apr. 30, 2008, which is based upon and claims the benefit of priority from the prior Japanese Patent Application No. P2005-368524, filed on Dec. 21, 2005 and Japanese Patent Application No. P2006-238093 filed on Sep. 1, 2006; the entire contents of both of which are incorporated herein by reference.

TECHNICAL FIELD

The present invention relates to a piezoelectric resonator plate, and a piezoelectric resonator device.

BACKGROUND ART

At present, examples of piezoelectric resonator devices include crystal oscillators, crystal resonators, and the like. Such a piezoelectric resonator device has a housing formed of a rectangular parallelepiped package. The package comprises a base and a lid. In the package, a piezoelectric resonator plate is held and bonded with the base using a conductive adhesive. By bonding the base with the lid, the piezoelectric resonator plate is hermetically enclosed in the package (see, for example, Patent Document 1 below).
Patent Document 1: JP 2005-191709A

DISCLOSURE OF INVENTION

Problem to be Solved by the Invention

In Patent Document 1, when the piezoelectric resonator plate is held on the base, the piezoelectric resonator plate is bonded with the base using a conductive adhesive. Also, electrodes having opposite polarities are provided on the base, and a conductive adhesive is applied on each electrode.

Therefore, in the case of the piezoelectric resonator device disclosed in Patent Document 1, in order to avoid a short circuit between the electrodes having opposite polarities, it is necessary to secure areas on the base in the package where the conductive adhesive is applied (bonding areas), and set the application amounts (use amounts) of the conductive adhesive, depending on the application areas. Therefore, the piezoelectric resonator device disclosed in Patent Document 1 is not suitable for miniaturization.

Therefore, in order to solve the above-described problem, an object of the present invention is to provide a piezoelectric resonator plate and a piezoelectric resonator device suited to miniaturization.

Means for Solving Problem

To achieve the above-described object, the present invention provides a piezoelectric resonator device in which a package is formed by bonding a base with a lid, a piezoelectric resonator plate is held on the base in the package, and an inside of the package is hermetically enclosed. The piezoelectric resonator plate is held on the base via a support member made of a brittle material. The base is electrically and mechanically bonded with the support member in a plurality of areas of the support member via a base bonding member using ultrasonic waves, and the piezoelectric resonator plate is electrically and mechanically bonded with the support member in one area of the piezoelectric resonator plate via a piezoelectric resonator plate bonding member using ultrasonic waves. The base bonding member and the piezoelectric resonator plate bonding member are connection bumps.

According to the present invention, the piezoelectric resonator plate is held on the base via the support member. The base is electrically and mechanically bonded with the support member in a plurality of areas of the support member via the base bonding member using ultrasonic waves, and the piezoelectric resonator plate is electrically and mechanically bonded with the support member in one area of the piezoelectric resonator plate via the piezoelectric resonator plate bonding member using ultrasonic waves. The base bonding member and the piezoelectric resonator plate bonding member are connection bumps. Therefore, even if stress is applied to the package when the piezoelectric resonator plate is held on the base or when the lid is bonded with the base, it is possible to suppress the stress from being applied to the piezoelectric resonator plate. Also, it is possible to suppress a variation in a position where the piezoelectric resonator plate is mounted in the package. Also, the package is preferably miniaturized. In particular, the effect of the present invention is more significant than that of a piezoelectric resonator device in which a piezoelectric resonator plate is bonded directly via a conductive adhesive with a base as in the conventional art.

In the above-described structure, a piezoelectric resonator plate bolster portion for suppressing the piezoelectric resonator plate from being bent may be provided on the support member.

In this case, the piezoelectric resonator plate bolster portion for suppressing the piezoelectric resonator plate from being bent is provided on the support member. Therefore, when the piezoelectric resonator plate is bonded with the support member using the piezoelectric resonator plate bonding member, the piezoelectric resonator plate can be stably placed without being inclined with respect to the mounted position of the piezoelectric resonator plate on the support member. This effect is particularly preferable when the piezoelectric resonator plate is bonded with the support member by a bonding technique using ultrasonic waves.

In the above-described structure, the plurality of areas of the support member may be areas near both side surfaces opposed to each other of the support member. The one area of the piezoelectric resonator plate may be in a vicinity of a side portion of the piezoelectric resonator plate.

In this case, the plurality of areas of the support member are areas near both side surfaces opposed to each other of the support member. The one area of the piezoelectric resonator plate is in a vicinity of a side portion of the piezoelectric resonator plate. Therefore, a change in characteristics of the piezoelectric resonator plate due to deformation of the base or the support member when the support member is bonded with the base via the base bonding member using ultrasonic waves or when the piezoelectric resonator plate is bonded with the support member via the piezoelectric resonator plate bonding member using ultrasonic waves, can be preferably suppressed.

Also, to achieve the above-described object, the present invention provides a piezoelectric resonator plate in which at least one excitation electrode is formed in each of both main surfaces of a substrate, and a plurality of extraction electrodes are formed by extending the excitation electrodes so as to electrically and mechanically bond the excitation electrodes with external electrodes. Extraction tip portions of the plurality of extraction electrodes are extended to a vicinity of at least one side portion of one of the main surfaces, and external electrodes are electrically and mechanically bonded with the extraction tip portions. An insulating material is formed at a position of the other main surface of the substrate, the position being opposed to the extraction tip portions formed on the one main surface.

According to the present invention, the extraction tip portions of the plurality of extraction electrodes are extended to a vicinity of at least one side portion of one of the main surfaces, and external electrodes are electrically and mechanically bonded with the extraction tip portions. An insulating material is formed at a position of the other main surface of the substrate, the position being opposed to the extraction tip portions formed on the one main surface. Therefore, even when an ultrasonic wave emitting member of an FCB apparatus is caused to directly contact the opposed position of the other main surface opposed to the extraction tip portions formed in the one main surface using FCB, the insulating material formed at the opposed position of the other main surface can be prevented from being fixedly attached to the ultrasonic wave emitting member of the FCB apparatus at the opposed position. Also, according to the present invention, when the extraction tip portions of the plurality of extraction electrodes are extended to a vicinity of at least one side portion of the one main surface, and external electrodes are electrically and mechanically bonded with the extraction tip portion, positions on the substrate where the external electrodes are connected can be all placed in a vicinity of one side portion of the one main surface, i.e., one area, which is preferable to miniaturization of the piezoelectric resonator plate.

In the above-described structure, the insulating material may be a metal oxide compound. Alternatively, the insulating material may be a material whose surface is insulated.

Also, to achieve the above-described object, the present invention provides a piezoelectric resonator plate in which at least one excitation electrode is formed in each of both main surfaces of a substrate, and a plurality of extraction electrodes are formed by extending the excitation electrodes so as to electrically and mechanically bond the excitation electrodes with external electrodes. Extraction tip portions of the plurality of extraction electrodes are extended to a vicinity of at least one side portion of one of the main surfaces, and external electrodes are electrically and mechanically bonded with the extraction tip portions. A material made of a single chromium layer is formed at a position of the other main surface of the substrate, the position being opposed to the extraction tip portions formed on the one main surface.

According to the present invention, the extraction tip portions of the plurality of extraction electrodes are extended to a vicinity of at least one side portion of one of the main surfaces, and external electrodes are electrically and mechanically bonded with the extraction tip portions. A material made of a single chromium layer is formed at a position of the other main surface of the substrate, the position being opposed to the extraction tip portions formed on the one main surface. Therefore, even when an ultrasonic wave emitting member of an FCB apparatus is caused to directly contact the opposed position of the other main surface opposed to the extraction tip portions formed in the one main surface using FCB, since the material made of the single chromium layer formed of at the opposed position of the other main surface is more rigid than gold and is easier to be bonded with the substrate of the piezoelectric resonator plate, the material made of the single chromium layer is lesser fixedly attached to the ultrasonic wave emitting member of the FCB apparatus than a material of gold. Also, when the extraction tip portions of the plurality of extraction electrodes are extended to a vicinity of one side portion of the one main surface, and external electrodes are electrically and mechanically bonded with the extraction tip portions, positions on the substrate where the external electrodes are connected can be all placed in a vicinity of one side portion of the one main surface, i.e., one area, which is preferable to miniaturization of the piezoelectric resonator plate.

Also, to achieve the above-described object, the present invention provides a piezoelectric resonator plate in which at least one excitation electrode is formed in each of both main surfaces of a substrate, and a plurality of extraction electrodes are formed by extending the excitation electrodes so as to electrically and mechanically bond the excitation electrodes with external electrodes. Extraction tip portions of the plurality of extraction electrodes are extended to a vicinity of at least one side portion of one of the main surfaces, and external electrodes are electrically and mechanically bonded with the extraction tip portions. The substrate is exposed at a position of the other main surface of the substrate, the position being opposed to the extraction tip portions formed on the one main surface.

According to the present invention, the extraction tip portions of the plurality of extraction electrodes are extended to a vicinity of at least one side portion of one of the main surfaces, and external electrodes are electrically and mechanically bonded with the extraction tip portions. The substrate is exposed at a position of the other main surface of the piezoelectric resonator plate, the position being opposed to the extraction tip portions formed on the one main surface. Therefore, even when an ultrasonic wave emitting member of an FCB apparatus is caused to directly contact the opposed position of the other main surface opposed to the extraction tip portions formed in the one main surface so as to use FCB, the substrate at the opposed position of the other main surface is not fixedly attached to the ultrasonic wave emitting member of the FCB apparatus. Also, when the extraction tip portions of the plurality of extraction electrodes are extended to a vicinity of one side portion of the one main surface, and external electrodes are electrically and mechanically bonded with the extraction tip portions, positions on the substrate where the external electrodes are connected can be all placed in a vicinity of one side portion of the one main surface, i.e., one area, which is preferable to miniaturization of the piezoelectric resonator plate.

In the above-described structure, the extraction tip portions of the plurality of extraction electrodes may be extended to a vicinity of at least one side portion of the one main surface, and external electrodes may be electrically and mechanically bonded with the extraction tip portions via piezoelectric resonator plate bonding members. A plurality of the piezoelectric resonator plate bonding members may be bonded with each extraction electrode.

In this case, the extraction tip portions of the plurality of extraction electrodes are extended to a vicinity of at least one side portion of the one main surface, and external electrodes can be electrically and mechanically bonded with the extraction tip portions via piezoelectric resonator plate bonding members. A plurality of the piezoelectric resonator plate bonding members are bonded with each extraction electrode. Therefore, positions on the substrate where the piezoelectric resonator plate is connected with the external electrodes can be all placed in a vicinity of one side portion of the one main surface, i.e., one area, which is preferable to miniaturization of the piezoelectric resonator plate, and the bonding strength between the piezoelectric resonator plate and the external electrodes can be increased.

In the above-described structure, the substrate may have an outer circumferential shape of a rectangular parallelepiped. A plurality of the piezoelectric resonator plate bonding members may be bonded with the extraction tip portion of each extraction electrode along a widthwise direction of the substrate.

In this case, the substrate has an outer circumferential shape of a rectangular parallelepiped. A plurality of the piezoelectric resonator plate bonding members are bonded with the extraction tip portion of each extraction electrode along a widthwise direction of the substrate. Therefore, for example, it is possible to prevent a short circuit between electrodes due to the use of a conductive adhesive. In particular, this effect becomes more significant as the piezoelectric resonator plate is further miniaturized.

Also, to achieve the above-described object, the present invention provides a piezoelectric resonator plate in which at least one excitation electrode is formed in each of both main surfaces of a substrate, and a plurality of extraction electrodes are formed by extending the excitation electrodes so as to electrically and mechanically bond the excitation electrodes with external electrodes. Extraction tip portions of the plurality of extraction electrodes are extended to a vicinity of at least one side portion of one of the main surfaces, and external electrodes are electrically and mechanically bonded with the extraction tip portions. The extraction tip portions of the extraction electrodes are formed higher than other portions. External electrodes are electrically and mechanically bonded with the higher portions than other portions of the extraction tip portions. It is particularly preferable that external electrodes be electrically and mechanically bonded with the higher portions using ultrasonic waves.

According to the present invention, the extraction tip portions of the plurality of extraction electrodes are extended to a vicinity of at least one side portion of one of the main surfaces, and external electrodes are electrically and mechanically bonded with the extraction tip portions. The extraction tip portions of the extraction electrodes are formed higher than other portions. External electrodes are electrically and mechanically bonded with the higher portions than other portions of the extraction tip portions. Therefore, it is possible to bond the extraction electrodes with external electrodes without additionally using a bonding member. As a result, it is possible to prevent a short circuit between electrodes due to the use of a bonding member. In particular, this effect becomes more significant as the piezoelectric resonator device is further miniaturized.

In the above-described structure, the extraction electrodes including the higher portions may be formed by photolithography.

In this case, the extraction electrodes including the higher portions are formed by photolithography. Therefore, the higher portions can be formed at the same time when the extraction electrodes are formed. Therefore, the extraction electrodes can be bonded with external electrodes without additionally using a bonding member or without forming the higher portions by an additional step apart from the extraction electrode forming step, thereby making it possible to suppress manufacturing cost.

In the above-described structure, the higher portions may be formed by plating.

When the higher portions are formed by plating, it is possible to form the higher portions in a batch process without occurrence of mechanical stress load due to formation of the higher portions on the piezoelectric resonator plate by plating, so that the degree of freedom of designing the surface areas, shapes and thicknesses of the higher portions can be considerably improved. Also, when the higher portions are formed by plating, the cost of equipment can be suppressed to a low level. Although the higher portions are here formed by plating, the present invention is not limited to this. The higher portions can be formed by vapor deposition or sputtering.

In the above-described structure, the higher portions may be formed of chromium and gold.

In this case, the higher portions are formed of chromium and gold. Therefore, bonding with external electrodes is caused to be easier.

Effects of the Invention

According to the present invention, a piezoelectric resonator plate and a piezoelectric resonator device suited to miniaturization can be provided.

BRIEF DESCRIPTION OF DRAWINGS

FIG. 1(a) is a plan view schematically showing an inside of the crystal resonator. FIG. 1(b) is a cross-sectional view, taken along line A-A of FIG. 1(a).

FIG. 2(a) is a plan view schematically showing the crystal resonator plate. FIG. 2(b) is a diagram schematically showing a rear side of the crystal resonator plate.

FIG. 6(a) is a plan view schematically showing the crystal resonator plate. FIG. 6(b) is a cross-sectional view, taken along line B-B of FIG. 6(a).

FIG. 9 is a diagram showing a structure of a crystal resonator plate held in the crystal resonator of FIG. 8. FIG. 9(a) is a plan view schematically showing the crystal resonator plate. FIG. 9(b) is a diagram schematically showing a rear side of the crystal resonator plate.

FIG. 10(a) is a plan view schematically showing the crystal resonator plate. FIG. 10(b) is a diagram schematically showing a rear side of the crystal resonator plate.

Figure 1:
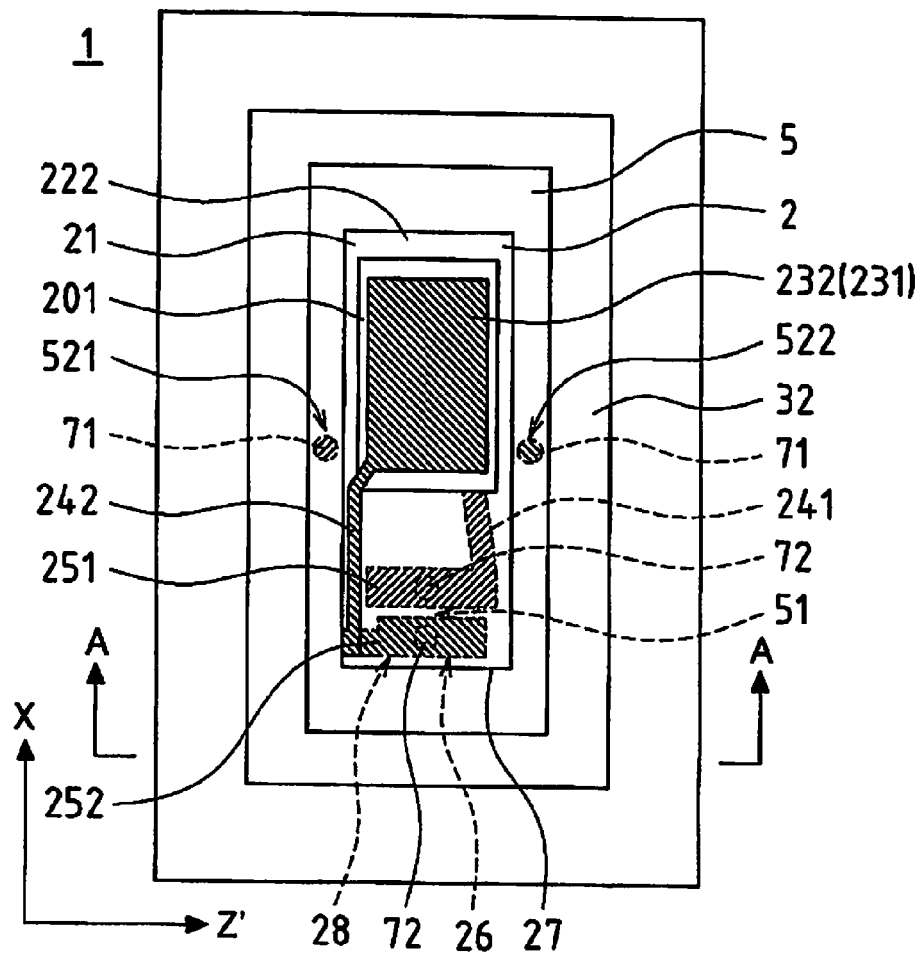
FIG. 1 is a diagram schematically showing a structure of a crystal resonator according to this example.
Figure 1:
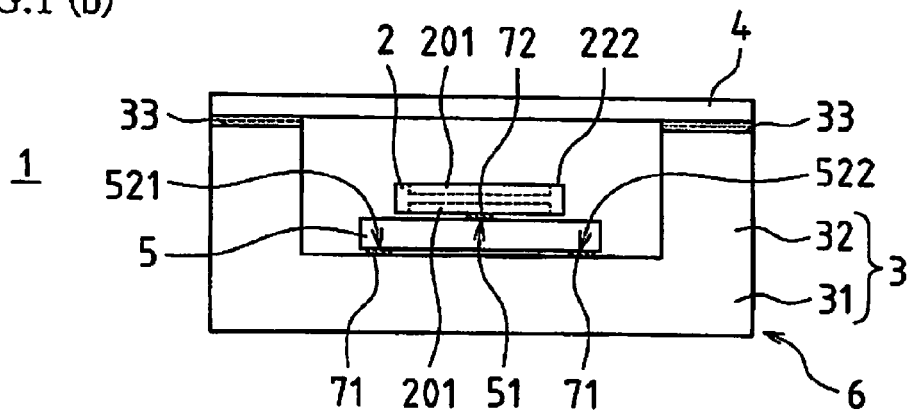

DESCRIPTION OF REFERENCE NUMERALS 1 crystal resonator (piezoelectric resonator device)
2 crystal resonator plate (piezoelectric resonator plate)
21 substrate
221, 222 both main surfaces
231, 232 excitation electrode
241, 242 extraction electrode 251, 252 extraction tip portion
26 area of substrate
27 side portion of substrate
28 opposed position
291, 292 higher portion
3 base
4 lid
5 support member
51 crystal resonator plate bonding area
521, 522 base bonding area
6 package
71 base bonding member
72 crystal resonator plate bonding member
8 tuning fork crystal resonator plate (piezoelectric resonator plate)
81 substrate
841, 842 both main surfaces
861, 862 excitation electrode
871, 872 extraction electrode
881, 882 extraction tip portion
89 opposed position

BEST MODE FOR CARRYING OUT THE INVENTION

Hereinafter, embodiments of the present invention will be described with reference to the accompanying drawings. Note that, in examples described below, the present invention is applied to a crystal resonator as a piezoelectric resonator device.

As shown in FIG. 1 (FIGS. 1(a) and 1(b)), a crystal resonator 1 according to this example comprises a thickness-shear vibration crystal resonator plate 2 (piezoelectric resonator plate as used herein), a base 3 for holding the crystal resonator plate 2, a lid 4 for hermetically enclosing the crystal resonator plate 2 held on the base 3, and a support member 5 for reducing external stress on the crystal resonator plate 2.

In the crystal resonator 1, the base 3 and the lid 4 constitute a package 6. An inner space is formed in the package 6 by bonding the base 3 with the lid 4. The crystal resonator plate 2 is held via the support member 5 on the base 3 in the inner space of the package 6, while the inner space of the package 6 is hermetically enclosed. In this case, as shown in FIG. 1, the base 3, the crystal resonator plate 2, and the support member 5 are electrically and mechanically bonded with each other via bonding members (base bonding members 71 and crystal resonator plate bonding members 72) by FCB (Flip Chip Bonding) using ultrasonic waves. Note that the base bonding member 71 and the crystal resonator plate bonding member 72 used in this example are connection bumps made of a metal material. Next, parts of the crystal resonator 1 will be described.

As shown in FIG. 1, the base 3 is formed in the shape of a box having a bottom portion 31 and a wall portion 32 which protrudes upward from the bottom portion 31. In the base 3, a rectangular parallelepiped made of a ceramic material is integrally stacked and formed by burning in a concave shape on a plate having a rectangular shape as viewed from the top. Also, the wall portion 32 is formed along an outer circumference on a surface of the bottom portion 31. An upper surface of the wall portion 32 is an area for bonding the base 3 with the lid 4. In the bonding area, a metallization layer 33 (e.g., a structure obtained by plating a tungsten metallization layer with nickel and gold in this order, or a structure made of tin and gold, or tin and silver) for bonding with the lid 4 is provided. Note that a glass layer may be provided instead of the metallization layer 33. The bonding strength between the base 3 and the lid 4 can be increased by forming the glass layer. A plurality of electrode pads (not shown) which are electrically and mechanically bonded with excitation electrodes 231 and 232 of the crystal resonator plate 2 are formed on the base 3. These electrode pads are electrically and mechanically bonded with terminal electrodes (not shown) formed on an outer-circumference on a rear surface of the base 3. These terminal electrodes are connected to an external part or an external apparatus. Note that the terminal electrodes and the electrode pads are integrally formed on the base 3 by burning after a metallization material, such as tungsten, molybdenum or the like, is printed. Thereafter, a portion of the terminal electrodes and the electrode pads is constructed by forming nickel plating on the metallization and forming gold plating on the nickel plating.

The lid 4 is made of a metal material and is formed into a plate having a rectangular shape as viewed from the top, as shown in FIG. 1(b). A solder material (not shown) is formed on a bottom surface of the lid 4. The lid 4 is bonded with the base 3 by a technique, such as seam welding, beam welding or the like, thereby constructing the package 6 (the lid 4 and the base 3) for the crystal resonator 1. Note that the lid 4 is formed of four layers of metal materials having different coefficients of thermal expansion, for example. Specifically, a silver solder layer (solder material), a copper layer, a Kovar layer, and a nickel layer are successively stacked from the bottom surface of the lid 4 which connects to the base 3. Since the silver solder layer and the copper layer are provided closer to the bottom surface of the lid, it is easy to achieve thermal bonding with the base 3 made of the ceramic as compared to the other layers. Also, since the Kovar layer is stacked on the silver solder layer and the copper layer, it is possible to enable the lid 4 to have substantially the same thermal expansion coefficient as that of the base 3 made of the ceramic so that the lid 4 is thermally deformed to the same level as that of the base 3. Also, since the nickel layer is formed at the uppermost surface, it is easy to achieve seam welding of the base 3 with the lid 4. Note that the Kovar layer is designed to be as thick as possible so as to achieve the same level of thermal deformation.

Figure 2:
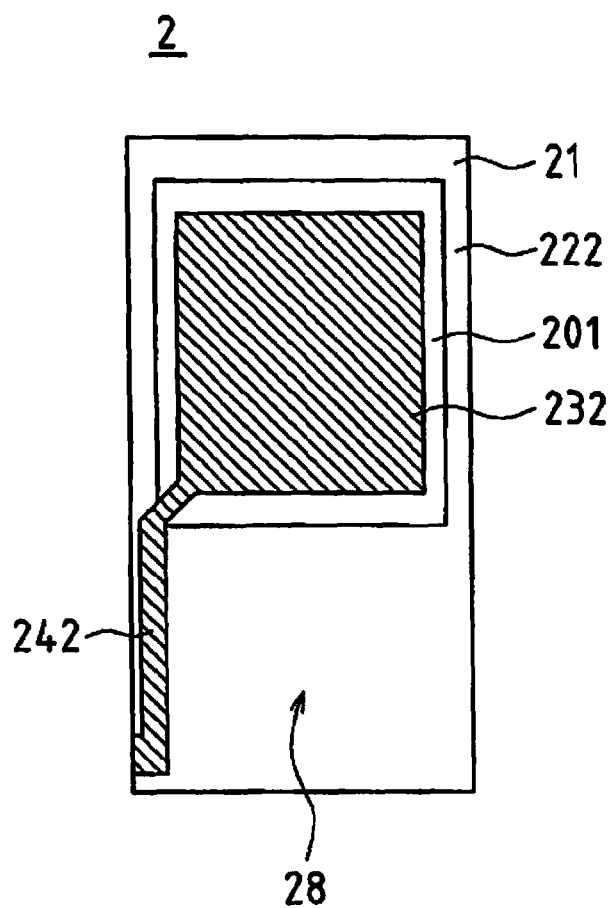
FIG. 2 is a diagram schematically showing a structure of a crystal resonator plate according to this example.
Figure 2:
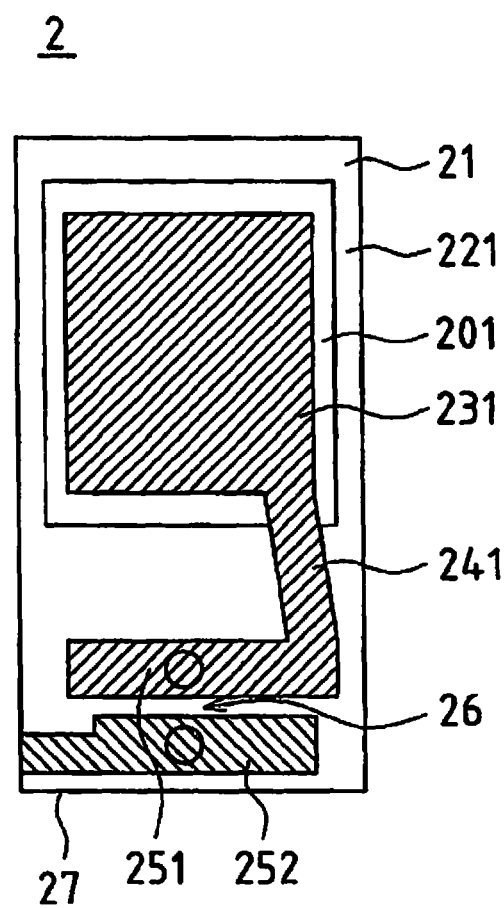

As shown in FIGS. 1 and 2 (FIGS. 2(a) and 2(b)), the crystal resonator plate 2 comprises a substrate 21 which is an AT-cut crystal strip, and is formed into a rectangular parallelepiped plate having a rectangular shape as viewed from the top. In other words, the outer circumferential shape of the substrate 21 is a rectangular parallelepiped. A concave portion 201 is formed in each of both main surfaces 221 and 222 of the substrate 21 so as to correspond to a higher frequency of the crystal resonator plate 2. The excitation electrodes 231 and 232 are formed in the respective concave portions 201. Extraction electrodes 241 and 242 extended from the excitation electrodes 231 and 232 are formed so as to electrically and mechanically bond the excitation electrodes 231 and 232 with external electrodes (the electrode pads of the base 3 in this example). Also, the crystal resonator plate 2 is bonded in an area 26 of the substrate 21 to the support member 5 by the crystal resonator plate bonding members 72. Note that the area 26 of the substrate 21 in this example is located in a vicinity of a side portion 27 of the substrate 21. Specifically, as shown in FIG. 2, extraction tip portions 251 and 252 of the extraction electrodes 241 and 242 are extended to the vicinity of the side portion 27 of the main surface 221. The excitation electrodes 231 and 232 are electrically and mechanically bonded with the electrode pads of the base 3 at the extraction tip portions 251 and 252 via the support member 5 by the crystal resonator plate bonding members 72 and the base bonding members 71. Also, as shown in FIGS. 1 and 2, in the crystal resonator plate 2, the substrate 21 is exposed at a position (hereinafter referred to as an opposed position 28) of the main surface 222 of the substrate 21, the portion being opposed to the extraction tip portions 251 and 252 formed in the main surface 221. Note that the excitation electrodes 231 and 232 and the extraction electrodes 241 and 242 are formed by photolithography in which, for example, from the substrate 21, chromium and gold (Cr—Au) are laminated in this order; or chromium, gold, and chromium (Cr—Au—Cr) are laminated in this order; or chromium, gold, and nickel (Cr—Au—Ni) are laminated in this order; or chromium, silver, and chromium (Cr—Ag—Cr) are laminated in this order; or chromium and nickel (Cr—Ni) are laminated in this order; or nickel and chromium (Ni—Cr) are laminated in this order.

The support member 5 is a Z plate formed of a crystal strip, which is a brittle material. The outer shape of the support member 5 is designed to be substantially the same as or smaller than that of the crystal resonator plate 2 as shown in FIG. 1. The support member 5 is formed into a rectangular parallelepiped plate having a rectangular shape as viewed from the top.

Also, as shown in FIG. 1, a crystal resonator plate bonding area 51 for bonding with the crystal resonator plate 2 is provided on one main surface (a front surface in FIG. 1) of the support member 5, while base bonding areas 521 and 522 for bonding with the base 3 are provided on the other main surface (a rear surface in FIG. 1) of the support member 5. An extension electrode (not shown) is extended between the crystal resonator plate bonding area 51 and the base bonding areas 521 and 522. The crystal resonator plate bonding area 51 as used here is provided in a vicinity of a side portion in a lengthwise direction of the support member 5 and in a vicinity of an intermediate portion in a width direction of the support member 5, as specifically shown in FIG. 1. Also, the base bonding areas 521 and 522 as used here are both areas near side surfaces opposed to each other of the support member 5, and as specifically shown in FIG. 1, are provided in vicinities of both side portions in the widthwise direction of the support member 5 and in the vicinity of an intermediate portion in the lengthwise direction of the support member 5.

Also, as shown in FIG. 1, the base 3 is bonded with the support member 5 at two points in the two base bonding areas 521 and 522 by the base bonding members 71 using ultrasonic waves. The crystal resonator plate 2 is electrically and mechanically bonded with the support member 5 at two points in a single crystal resonator plate bonding area 51 by the crystal resonator plate bonding members 72 using ultrasonic waves. By these bonding processes, the excitation electrodes 231 and 232 of the crystal resonator plate 2 are electrically and mechanically bonded with the respective electrode pads of the base 3 via the extraction electrodes 241 and 242, the crystal resonator plate bonding members 72, the extension electrode of the support member 5, and the base bonding members 71. Note that, in the package 6 with the excitation electrodes 231 and 232 of the crystal resonator plate 2 being electrically and mechanically bonded with the electrode pads of the base 3, a line segment between the two points of the base bonding members 71 is referred to as a first line segment, and a line segment between the two points of the crystal resonator plate bonding members 72 is referred to as a second line segment. The first line segment and the second line segments of this example are designed to have a relationship such that the first line segment and the second line segment do not intersect and the line segment direction of the first line segment and the line segment direction of the second line segment intersect orthogonally when the package 6 is viewed from the top.

When the support member 5 is bonded with the base 3, and the crystal resonator plate 2 is thermally bonded with the support member 5, outer shape deformation or distortion occurs in each part. Stress, such as thermal stress, occurs in the package 6 due to the outer shape deformation or distortion. The stress is applied via the support member 5 to the crystal resonator plate 2.

However, according to the crystal resonator 1 of this example noted above, the crystal resonator plate 2 is held on the base 3 via the support member 5 made of a brittle material. Therefore, even if stress is applied to the package 6 when the crystal resonator plate 2 is held on the base 3 or the lid 4 is bonded with the base 3, it is possible to suppress the stress being applied to the crystal resonator plate 2. In particular, the effect of the crystal resonator 1 of this example is more significant than that of a crystal resonator in which a crystal resonator plate is bonded directly via a conductive adhesive with a base as in the conventional art.

Specifically, the crystal resonator plate 2 is held on the base 3 via the support member 5 made of a brittle material. The base 3 is bonded with the support member 5 via the base bonding members 71 in a plurality of areas of the support member 5 (the base bonding areas 521 and 522 in this example) using ultrasonic waves. In addition, the crystal resonator plate 2 is electrically and mechanically bonded with the support member 5 via the crystal resonator plate bonding members 72 in the area 26 of the crystal resonator plate 2 (the crystal resonator plate bonding area 51 of the support member 5 in this example) using ultrasonic waves. The base bonding member 71 and the crystal resonator plate bonding member 72 are connection bumps. Therefore, even if stress is applied to the package 6 when the crystal resonator plate 2 is held on the base 3 or the lid 4 is bonded with the base 3, it is possible to suppress the stress from being applied to the crystal resonator plate 2. Also, it is possible to suppress a variation in a position where the crystal resonator plate 2 is mounted on the package 6. Also, it is possible to avoid a short circuit due to closely located connection points and a decrease in conductivity due to a reduction in size of connection points, whereby the present invention is preferable to miniaturization of the package 6.

Also, as shown in FIG. 1, the support member 5 has the crystal resonator plate bonding area 51 for bonding with the crystal resonator plate 2 and the base bonding areas 521 and 522 for bonding with the base 3. Specifically, a plurality of areas of a support member as used herein are both areas near the side surfaces (the base bonding areas 521 and 522) opposed to each other of the support member 5. An area of a crystal resonator plate as used herein is an area (the crystal resonator plate bonding area 51 of the support member 5) in the vicinity of the side portion 27 of the crystal resonator plate 2. Therefore, a change in characteristics of the crystal resonator plate 2 due to deformation of the base 3 or the support member 5 caused when the support member 5 is bonded with the base 3 via the base bonding members 71 using ultrasonic waves or when the crystal resonator plate 2 is bonded with the support member 5 via the crystal resonator plate bonding members 72 using ultrasonic waves, can be preferably suppressed. Specifically, the support member 5 can reduce external pressure from a support system (e.g., bonding members, etc.) which is used for bonding of each part during manufacture of the crystal resonator plate 2, whereby stress having an adverse influence on the characteristics of the crystal resonator plate 2 can be buffered. As a result, it is possible to reduce stress of a support system (e.g., the base 3, bonding members, etc.) which is applied to the crystal resonator 1, thereby making it possible to improve characteristics of the crystal resonator 1, such as equivalent constant (series resonance resistance value) characteristics, spurious characteristics, temperature characteristics, aging characteristics, and the like. Although the support system is herein related to bonding members which are used to bond the base 3 with the support member 5, external stress includes stress in other support systems, such as stress occurring in the bond between the base 3 and the lid 4, and the like.

Figure 3:
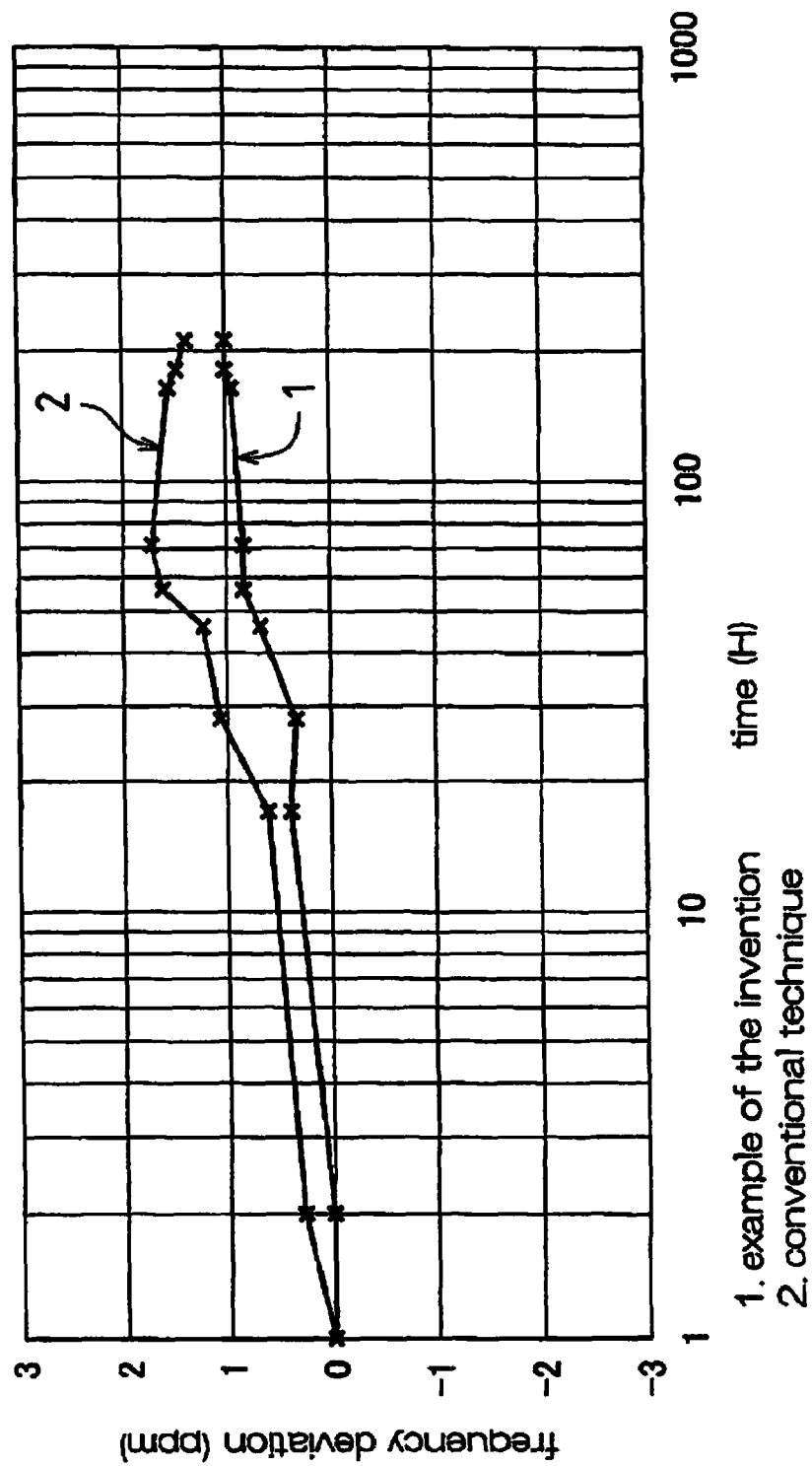
FIG. 3 is a graph showing the results of measurement of aging characteristics of the crystal resonator of this example and a conventional crystal resonator.

Next, regarding the crystal resonator 1 of this example and a conventional crystal resonator in which a crystal resonator plate is bonded directly via a connection bump with a base, their aging characteristics were measured over about 200 hours. The results are shown in FIG. 3. Note that, in FIG. 3, the aging characteristics of the crystal resonator of this example are indicated by reference numeral 1, while the aging characteristics of the conventional crystal resonator are indicated by reference numeral 2. As shown in FIG. 3, in the aging characteristics of the crystal resonator 1 of this example, the frequency deviation is suppressed within 1 ppm over about 200 hours. In contrast to this, the frequency deviation of the conventional technique exceeds 1 ppm. In other words, a variation in frequency occurs over time in the conventional technique. It can be clearly understood from this that the crystal resonator 1 of this example has satisfactory aging characteristics.

Figure 4:
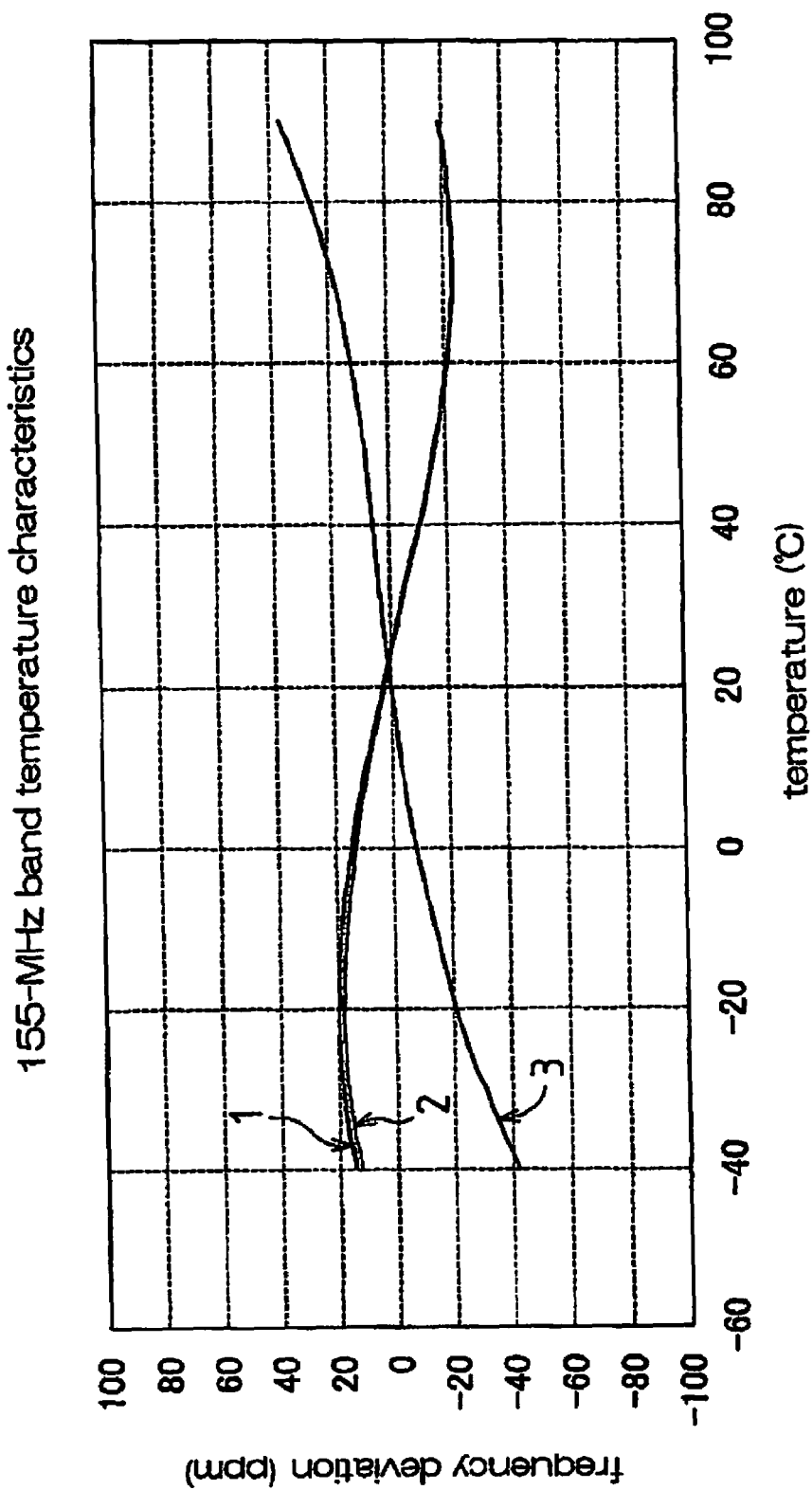
FIG. 4 is a graph showing the results of measurement of temperature characteristics of the crystal resonator of this example, a crystal resonator according to a conventional technique 1, and a crystal resonator according to a conventional technique 2.

Also, regarding the crystal resonator 1 of this example, a first conventional crystal resonator in which a crystal resonator plate is bonded directly via a connection bump with a base, and a second conventional crystal resonator in which a crystal resonator plate is bonded directly via a conductive adhesive with a base, their temperature characteristics in a 155-MHz band were measured. The results are shown in FIG. 4. Note that, in FIG. 4, the temperature characteristics of the first conventional crystal resonator are indicated by reference numeral 1, the temperature characteristics of the crystal resonator of this example are indicated by reference numeral 2, and the temperature characteristics of the second conventional crystal resonator are indicated by reference numeral 3. As shown in FIG. 4, in the first conventional technique in which a crystal resonator plate is bonded directly via a connection bump with a base, the temperature characteristics of the crystal resonator are satisfactory (the frequency deviation is about ±20 ppm). However, in the first conventional technique, the external stress as described above is transferred to the crystal resonator plate, so that the series resonance resistance value characteristics, spurious characteristics, aging characteristics or the like of the crystal resonator are deteriorated. In contrast to this, in the second conventional technique in which a crystal resonator plate is bonded directly via a conductive adhesive with a base so as to suppress a deterioration in the series resonance resistance value characteristics, spurious characteristics or the like of the crystal resonator, the temperature characteristics are deteriorated (the frequency deviation is about ±40 ppm) as shown in FIG. 4. In contrast to the first and second conventional techniques, in the crystal resonator 1 of this example, the temperature characteristics are not deteriorated and, in addition, other characteristics (series resonance resistance value characteristics, spurious characteristics, and aging characteristics (FIG. 3), etc.) of the crystal resonator 1 are not deteriorated, as shown in FIG. 4. It can be clearly understood from this that the crystal resonator 1 of this example has satisfactory temperature characteristics.

Also, since the substrate 21 is exposed at the opposed position 28 of the crystal resonator plate 2, even when a member of an FCB apparatus which emits ultrasonic waves is caused to directly contact the opposed position 28 by FCB, the substrate 21 at the opposed position 28 is not fixedly attached to the ultrasonic wave emitting member of the FCB apparatus.

Also, since the support member 5 is made of a brittle material, the expansion coefficient of the support member 5 is approximate to the expansion coefficient of the crystal resonator plate 2. Therefore, the support member 5 provided between the base 3 and the crystal resonator plate 2 does not cause a deterioration in characteristics of the crystal resonator plate 2 and can buffer external stress.

Also, as shown in FIG. 1, since the outer shape of the support member 5 is designed to be substantially the same as or smaller than the outer shape of the crystal resonator plate 2, the support member 5 does not prevent miniaturization of the crystal resonator 1, so that the crystal resonator 1 can be miniaturized.

Also, since the crystal resonator plate 2 is a crystal strip and the support member 5 is a Z plate made of a crystal strip, i.e., these are made of materials which are less affected by anisotropy, these parts are less affected by anisotropy during etching when the support member 5 is formed, so that the support member 5 can be readily formed into any shape. Note that, when the support member 5 is formed of an AT-cut plate which is similar to that of the crystal resonator plate, the AT-cut plate is more easily affected by etching when the support member 5 is formed than the Z plate. Therefore, in this case, even when etching is desired to be performed in a direction perpendicular to a previously set axis, etching is performed in an oblique direction, so that it is difficult to form the support member 5 into any shape. Therefore, it is preferable that the support member 5 be made of a Z plate. Also, since the support member 5 is made of a material which is less affected by anisotropy, the support member 5 is not affected by vibration of the crystal resonator plate 2, and the support member 5 can prevent deterioration of characteristics of the crystal resonator plate 2. Also, since the crystal resonator plate 2 and the support member 5 are made of the same crystal strip, they have the same expansion coefficient. Therefore, the support member 5 provided between the base 3 and the crystal resonator plate 2 preferably buffers external stress.

Also, the first line segment and the second line segment do not intersect and, further, the line segment direction of the first line segment and the line segment direction of the second line segment intersect orthogonally when the package 6 is viewed from the top. Therefore, it is possible to suppress a change in characteristics of the crystal resonator plate 2 due to deformation of the base 3 caused by bonding the support member 5 with the base 3 via the base bonding members 71 or bonding the crystal resonator plate 2 with the support member 5 via the crystal resonator plate bonding members 72. For example, as a comparative example, in the case of a crystal resonator in which the first line segment direction and the second line segment direction are in parallel when the package is viewed from the top, thermal stress is applied to the support member when the crystal strip is bonded with the base, so that the support member as it is bent is bonded with the base. Thereafter, when the crystal resonator plate is bonded with the bent support member, thermal stress is applied to the crystal resonator plate, so that the crystal resonator plate as it is bent with reference to the bent support member is bonded with the support member. Therefore, in this crystal resonator, external stress is easily applied to the crystal resonator plate, and therefore, even when the support member is interposed between the base and the crystal resonator plate, the above-described effect of suppressing external stress is not significantly exhibited. In other words, external stress on the crystal resonator plate is not sufficiently buffered, so that the characteristics of the crystal resonator plate are affected by the external stress. In contrast to this, according to the crystal resonator 1 of this example, the first line segment and the second line segment do not intersect and, further, the line segment direction of the first line segment and the line segment direction of the second line segment intersect orthogonally when the package 6 is viewed from the top. Therefore, the above-described problem does not arise, and it is possible to avoid external stress which has an adverse influence on the characteristics of the crystal resonator plate 2. Note that the relationship between the first line segment and the second line segment shown in the crystal resonator 1 of this example is a preferred example in which external stress on the crystal resonator plate is suppressed, and the comparative example is only for the illustrative purpose of describing the relationship between the first line segment and the second line segment.

Although a crystal strip is applied as the support member 5 in this example, the present invention is not limited to this. The support member 5 may be made of any brittle material. For example, a glass material which is not anisotropic may be used.

Also, although the lid 4 formed in the shape of a rectangular parallelepiped plate having a rectangular shape as viewed from the top and the base 3 formed in a concave shape are used in this example as shown in FIG. 1, the present invention is not limited to this. The base 3 and the lid 4 may have any shapes as long as the crystal resonator plate 2 can be hermetically enclosed by the base and the lid.

Also, although one excitation electrode 231 or 232 is formed in each of both the main surfaces 221 and 222 of the crystal resonator plate 2 in this example, the present invention is not limited to this. Any number of excitation electrodes may be provided in each of the main surfaces 221 and 222, depending on the purpose of use. For example, two excitation electrodes may be formed in each of both the main surfaces, or one excitation electrode may be formed in one main surface while two excitation electrodes may be formed in the other main surface (filter element structure).

Figure 5:
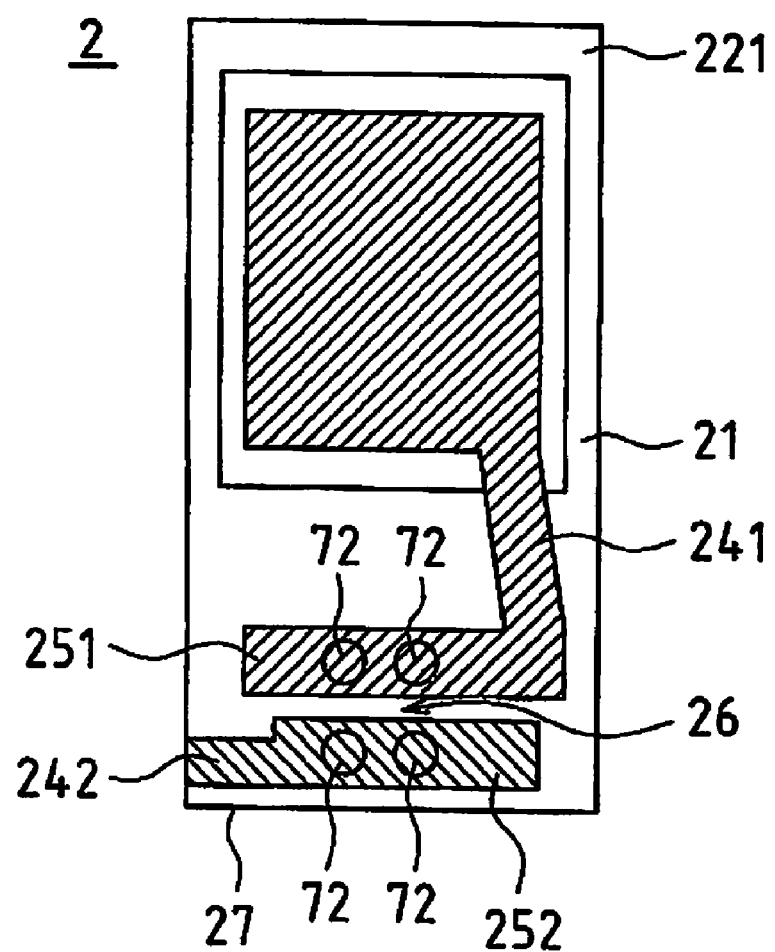
FIG. 5 is a plan view schematically showing a structure of a crystal resonator plate according to another example of the present invention.

Also, although the extraction tip portions 251 and 252 of the extraction electrodes 241 and 242 are bonded with the support member 5 using one crystal resonator plate bonding member 72 for each extraction tip portion in the crystal resonator plate 2 of this example as shown in FIGS. 1 and 2, the present invention is not limited to this. A plurality of crystal resonator plate bonding members may be used for each extraction electrode. Specifically, as shown in FIG. 5, two crystal resonator plate bonding members 72 may be bonded with each of the extraction tip portions 251 and 252 along the widthwise direction of the crystal resonator plate 2.

In this case, a plurality of crystal resonator plate bonding members 72 are used for one extraction electrode 241 (242), positions on the substrate 21 of the crystal resonator plate 2 where the external electrodes are connected (the support member 5 in this example) can be all provided in the vicinity of the side portion 27 of the main surface 221, i.e., within the area 26, which is preferable to miniaturization of the crystal resonator plate 2. In addition, the bonding strength between the crystal resonator plate 2 and the external electrodes (the support member 5 in this example) can be increased. In particular, as shown in FIG. 5, it is preferable to miniaturization of the crystal resonator plate 2 when connection bumps are used as the crystal resonator plate bonding members 72. Also, a plurality of crystal resonator plate bonding members 72 are bonded with the extraction tip portion 251(252) along the widthwise direction of the substrate for each extraction electrode 241 (242). Therefore, for example, it is possible to prevent a short circuit between electrodes due to the use of a conductive adhesive having a large bonding area. In particular, this effect becomes more significant as the crystal resonator plate 2 is further miniaturized.

Figure 6:
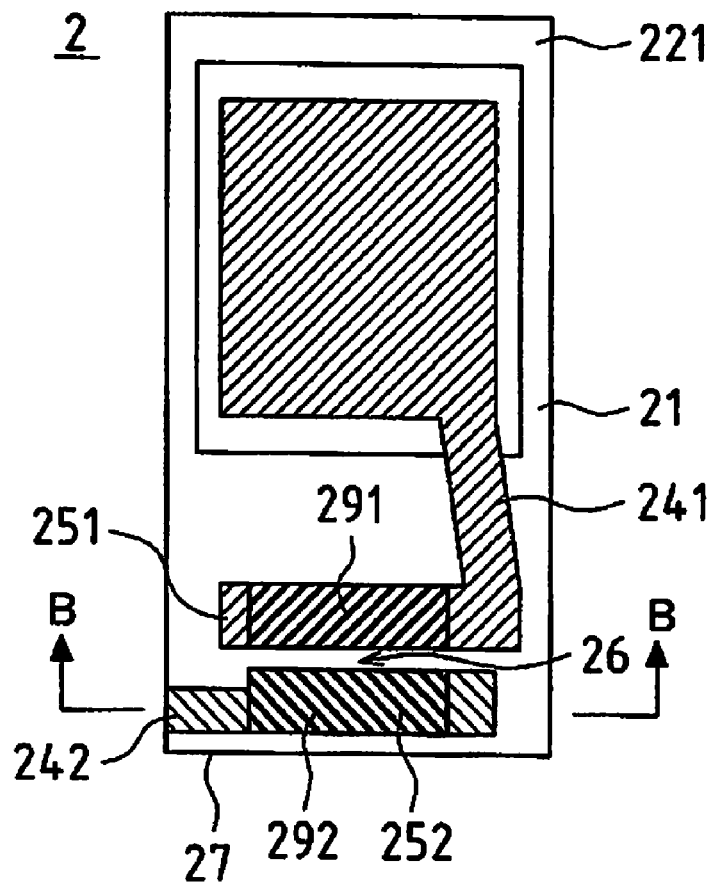
FIG. 6 is a diagram schematically showing a crystal resonator plate according to another example of the present invention.
Figure 6:
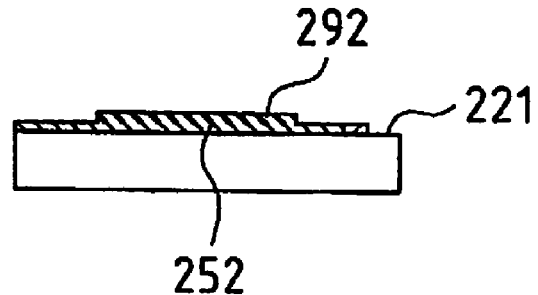

Although the extraction tip portions 251 and 252 of the extraction electrodes 241 and 242 of the crystal resonator plate 2 are bonded with the electrode pads of the base 3 via the support member 5, the crystal resonator plate bonding members 72, and the base bonding members 71 in this example as shown in FIG. 1, the present invention is not limited to this. For example, as shown in FIG. 6 (FIGS. 6(a) and 6(b)), the extraction tip portions 251 and 252 of the extraction electrodes 241 and 242 of the crystal resonator plate 2 may be formed thicker (greater height) than other portions, and the electrode pads of the base 3 may be electrically and mechanically bonded with higher portions 291 and 292 of the extraction tip portions 251 and 262 which are formed higher than the other portions. The higher portions 291 and 292 are formed of successive layers of chromium and gold by photolithography at the same time when the extraction electrodes 241 and 242 are formed. Also, the higher portions 291 and 292 of FIG. 6 are formed by plating. Note that the plating as used here is performed by an electroplating technique or an electroless plating technique. Also, when the electroplating technique is used, an extraction electrode for connecting all plated bump forming areas in common is required. Also, specific examples of a material for plating include gold, gold-tin, solder, and the like. Also, when the thickness of a resist used in photolithography is a general thickness of about 25 μm, the thickness of the plating is preferably set to be about 80% of the resist thickness. In this case, the thickness of the plating is preferably about 20 μm.

In this case, the extraction tip portions 251 and 252 of the two extraction electrodes 241 and 242 of the crystal resonator plate 2 are extended to the vicinity of the side portion 27 of the main surface 221, the electrode pads of the base 3 are electrically and mechanically bonded with the extraction tip portions 251 and 252, the extraction tip portions 251 and 252 of the extraction electrodes 241 and 242 are formed thicker (greater height) than other portions, and the electrode pads of the base 3 are electrically and mechanically bonded with the higher portions 291 and 292 formed higher than the other portions of the extraction tip portions, so that the electrode pads of the base 3 can be bonded with the extraction electrodes 241 and 242 without additionally providing a bonding member, such as a connection bump, a conductive adhesive or the like. As a result, it is possible to prevent a short circuit between electrodes due to the use of a bonding member (particularly, a conductive adhesive). In particular, this effect becomes more significant as the crystal resonator plate 2 is further miniaturized. Also, the extraction electrodes 241 and 242 including the higher portions 291 and 292 are formed by photolithography, so that the higher portions 291 and 292 can also be formed at the same time when the extraction electrodes 241 and 242 are formed. Therefore, the electrode pads of the base 3 can be bonded with the extraction electrodes 241 and 242 of the crystal resonator plate 2 without additionally using a bonding member and without forming the higher portions 291 and 292 by an additional step apart from the step of forming the extraction electrodes 241 and 242, thereby making it possible to suppress the manufacturing cost. Further, when the higher portions 291 and 292 include chromium and gold, it is easy to bond with external electrodes (see the support member 5 of FIGS. 1 and 6). Also, when the higher portions 291 and 292 are formed by plating, it is possible to form the higher portions 291 and 292 in a batch process without occurrence of mechanical stress load due to formation of the higher portions 291 and 292 on the crystal resonator plate 2 by plating, so that the degree of freedom of designing the surface areas, shapes and thicknesses of the higher portions 291 and 292 can be considerably improved. Also, when the higher portions 291 and 292 are formed by plating, the cost of equipment can be suppressed to a low level. Although the higher portions 291 and 292 are here formed by plating, the present invention is not limited to this. The higher portions 291 and 292 may be formed by vapor deposition or sputtering.

Also, in this example, by causing a member of the FCB apparatus which emits ultrasonic waves to directly contact the opposed position 28 of the crystal resonator plate 2 using FCB, the crystal resonator plate 2 is bonded via the crystal resonator plate bonding members 72 with the support member 5. When an electrode made of gold is formed at the opposed position 28 of the crystal resonator plate 2 which is in contact with the ultrasonic wave emitting member of the FCB apparatus (though it is an embodiment different from this example), the electrode made of gold sticks to the ultrasonic wave emitting member of the FCB apparatus, i.e., the electrode made of gold is peeled off the crystal resonator plate 2 and is fixedly attached to the ultrasonic wave emitting member of the FCB apparatus. Therefore, when another crystal resonator plate 2 is bonded with the support member 5 while the electrode made of gold is fixedly attached to the ultrasonic wave emitting member of the FCB apparatus, the bonding strength by FCB becomes smaller. Therefore, when the electrode made of gold is fixedly attached to the ultrasonic wave emitting member of the FCB apparatus, the fixedly attached electrode made of gold needs to be removed. According to this example, to solve this problem, the substrate 21 is exposed at the opposed position 28 of the crystal resonator plate 2 as shown in FIGS. 1 and 2, so that the above-described problem does not arise. Although, according to the crystal resonator plate 2 of this example, the substrate 21 is exposed at the opposed position 28 of the crystal resonator plate 2 as shown in FIGS. 1 and 2, the configuration for solving the above-described problem is not limited to this. An insulating material may be formed at the opposed position 28 of the crystal resonator plate 2. The insulating material as used here may be a material the entirety of which is made of an insulating material or a material only whose surface is insulated. Examples of the insulating material include insulating materials, such as magnesium fluoride, silicon oxide, silicon dioxide and the like, and metal oxide compounds, such as chromium oxide and the like. For example, an insulating material obtained by oxidizing a surface of a material made of chromium may be used. Further, to solve the above-described problem, not only an insulating material is formed at the opposed position 28 of the crystal resonator plate 2, but also an extraction electrode formed of a single chromium layer may be formed at the opposed position 28 of the crystal resonator plate 2. The reason why the single chromium layer is here mentioned is that chromium is harder than gold and provides a greater bonding strength with the substrate 21 of the crystal resonator plate 2, so that the single chromium layer is lesser fixedly attached to the ultrasonic wave emitting member of the FCB apparatus than the above-described material made of gold. Also, instead of the single chromium layer, for example, at least the opposed position 28 of the extraction tip portions 251 and 252 in a part of the excitation electrodes 231 and 232 and the extraction electrodes 241 and 242 may be extraction electrodes formed by laminating chromium and nickel in this order (the order may be reversed). Also, chromium and gold may be successively laminated, and thereafter, only gold may be removed from the surface, thereby providing a single chromium layer. In other words, any combination may be used as long as chromium is provided at the surface.

As described above, an extraction electrode made of an insulating material or a single chromium layer is formed at the opposed position 28 of the crystal resonator plate 2. Therefore, even when the ultrasonic wave emitting member of the FCB apparatus is caused to directly contact the opposed position 28 of the crystal resonator plate 2 using FCB, the material made of the insulating material or the single chromium layer formed at the opposed position 28 of the crystal resonator plate 2 can be prevented from being fixedly attached to the ultrasonic wave emitting member of the FCB apparatus.

Also, although the support member 5 formed in a rectangular parallelepiped plate having a rectangular shape as viewed from the top (FIG. 1) is used in this example, the shape of the support member is not limited to this. A concave portion may be provided so as to suppress thermal stress from being transferred to the crystal resonator plate 2. Also, a crystal resonator plate bolster portion may be provided so as to suppress the crystal resonator plate 2 from being bent with respect to the support member 5 by bonding the support member 5 with an area of the crystal resonator plate 2. In particular, by providing the crystal resonator plate bolster portion to the support member, when the crystal resonator plate 2 is bonded with the support member 5 using the crystal resonator plate bonding members 72, the crystal resonator plate 2 can be stably placed without being inclined with respect to the mounted position of the crystal resonator plate 2 on the support member 5. Specifically, the crystal resonator plate bolster portion is a protrusion portion which is formed on a main surface facing the crystal resonator plate 2 of the support member 5. When the crystal resonator plate bolster portion is provided to the support member of FIG. 1, the crystal resonator plate bolster portion is desirably placed in a vicinity of the other side portion in the lengthwise direction of the support member 5 and in a vicinity of an intermediate portion in the widthwise direction of the support member 5, taking the crystal resonator plate bonding area 51 into consideration.

Also, although the extraction tip portions 251 and 252 of the extraction electrodes 241 and 242 are extended to the vicinity of the side portion 27 of the main surface 221 in this example, the present invention is not limited to this. The extraction tip portions 251 and 252 may be only extended to the main surface 221. For example, the extraction tip portions 251 and 252 of the extraction electrodes 241 and 242 may be extended to the vicinity of the side portion 27 of the main surface 221 and a vicinity of a side portion opposed to the side portion 27. However, the configuration in which the extraction tip portions 251 and 252 of the extraction electrodes 241 and 242 are extended to the vicinity of the side portion 27 of the main surface 221 as shown in this example, i.e., the extraction tip portions 251 and 252 are both extended in the area 26, is preferable to miniaturization of the package 6.

Also, although the relationship between the first line segment of the base bonding members 71 and the second line segment of the crystal resonator plate bonding members 72 is designed so that the first line segment and the second line segment do not intersect and the line segment direction of the first line segment and the line segment direction of the second line segment intersect orthogonally when the package 6 is viewed from the top, in this example, this is a preferred example and the present invention is not limited to this. As shown in FIG. 7(a), the relationship between the first line segment and the second line segment may be designed so that the first line segment and the second line segment do not intersect and the line segment direction of the first line segment and the line segment direction of the second line segment are in parallel when the package 6 is viewed from the top.

Figure 7:
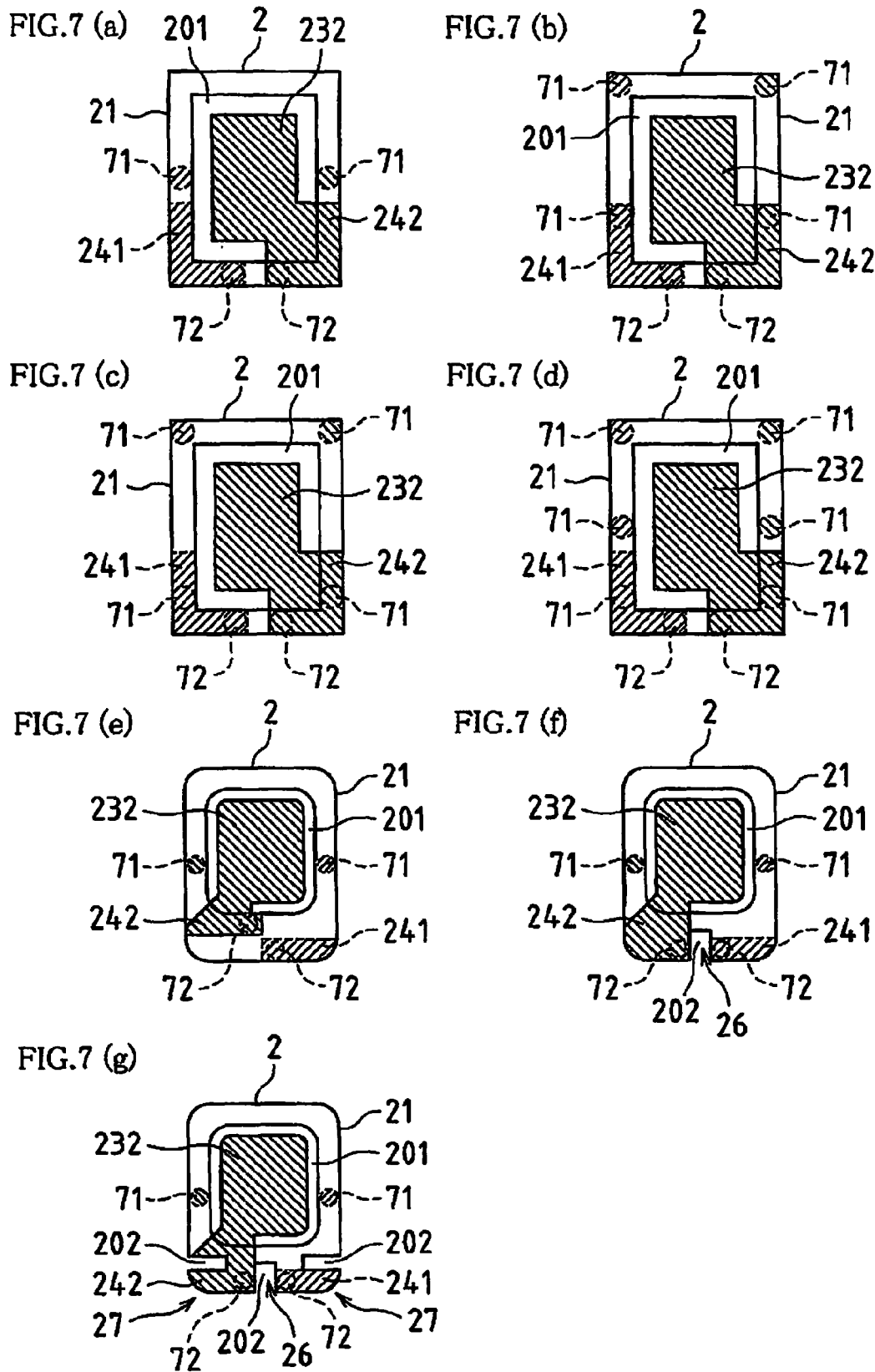
FIGS. 7(a) to 7(g) are plan views schematically showing crystal resonator plates according to other examples of the present invention.

Also, as shown in FIGS. 7(*b*) to 7(*d*), connection points of base bonding members 71 may be added, and the relationship between the first line segments and the second line segment may be designed so that the first line segments and the second line segment do not intersect and the line segment directions of the first line segments and the line segment direction of the second line segment are in parallel and intersect orthogonally when the package 6 is viewed from the top. In this case, the support member 5 is bonded with the base 3 at corner portions of the support member 5, so that the bonding strength of the support member 5 with the base 3 can be increased. As a result, the crystal resonator plate 2 can be stably bonded with the support member 5.

Also, in the above-described variation (FIGS. 7(*a*) to 7(*d*)), since the crystal resonator plate 2 can be bonded with the support member 5 while each of the crystal resonator plate bonding members 72 are positioned close, it is possible to suppress the crystal resonator plate 2 from being affected by external stress. As a result, the CI value can be reduced and the frequency deviation can be suppressed.

Also, although the bonding positions where the crystal resonator plate 2 is bonded with the support member 5 using the crystal resonator plate bonding members 72 are close to each other in this example (see, for example, FIG. 2) and a variation (see, for example, FIG. 7(*a*)) as described above, the bonding position of the present invention is not limited to this. An example as shown in FIG. 7(*e*) is possible. In the example of FIG. 7(*e*), the relationship between the first line segment and the second line segment may be designed so that the first line segment and the second line segment do not intersect and the line segment direction of the first line segment and the line segment direction of the second line segment are not in parallel and do not intersect orthogonally when the package 6 is viewed from the top. In this case, by forming the crystal resonator plate bonding members 72 so that the second line segment direction runs along a desired crystallographic axis, it is possible to further suppress the crystal resonator plate 2 from being affected by external stress. Note that the substrate 21 of FIG. 7(*e*) has four curved corner portions of the rectangular parallelepiped as viewed from the top.

Also, although the substrate 21 formed of an AT-cut crystal strip is formed into a rectangular parallelepiped plate having a rectangular shape as viewed from the top as described above, the present invention is not limited to this. As shown in FIGS. 7(*f*) and 7(*g*), a notch portion(s) 202 may be formed in the area 26 of the substrate 21. Note that the substrates 21 of FIGS. 7(*f*) and 7(*g*) each have four curved corner portions of the rectangular parallelepiped as viewed from the top.

In the substrate 21 of FIG. 7(*f*), a notch portion 202 is formed between the bonding positions of the crystal resonator plate bonding members 72 in the side portion 27 of the substrate 21. In this case, the crystal resonator plate 2 can be suppressed from being affected by external stress. As a result, it is possible to reduce the CI value and suppress the frequency deviation. Further, bending due to vibration can be suppressed. Also, the notch portion 202 can prevent a short circuit between the extraction electrodes 241 and 242. Note that, in the example of FIG. 7(*f*), a connection bump made of a metal material is used as the crystal resonator plate bonding member 72, which is preferable to miniaturization and increase of frequency, and prevention of a short circuit between the extraction electrodes 241 and 242.

Also, in the substrate 21 of FIG. 7(*g*), a notch portion 202 is formed between the bonding position of the crystal resonator plate bonding members 72 in the area 26 of the substrate 21, and notch portions 202 are formed in the side portion 27 of the substrate 21 and in side surfaces in the lengthwise direction of the rectangular parallelepiped as viewed from the top. In this case, as is similar to the example of FIG. 7(*f*), the crystal resonator plate 2 can be suppressed from being affected by external stress. As a result, the CI value can be reduced and the frequency deviation can be suppressed. In addition, preferably, bending due to vibration is further suppressed as compared to the example of FIG. 7(*f*). Also, the notch portions 202 can prevent a short circuit between the extraction electrodes 241 and 242. Note that, in the example of FIG. 7(*g*), a connection bump made of a metal material is used as the crystal resonator plate bonding member 72, which is preferable to miniaturization and increase of frequency, and prevention of a short circuit between the extraction electrodes 241 and 242.

Also, although the crystal resonator plate 2 formed of an AT-cut crystal strip is used in this example as shown in FIG. 2, the present invention is not limited to this. Other piezoelectric resonator plates may be used. Specifically, a tuning fork crystal resonator plate (hereinafter referred to as a crystal resonator plate 8 as shown in FIGS. 8 and 9 (FIG. 9(*a*) and FIG. 9(*b*)) may be used.

Figure 8:
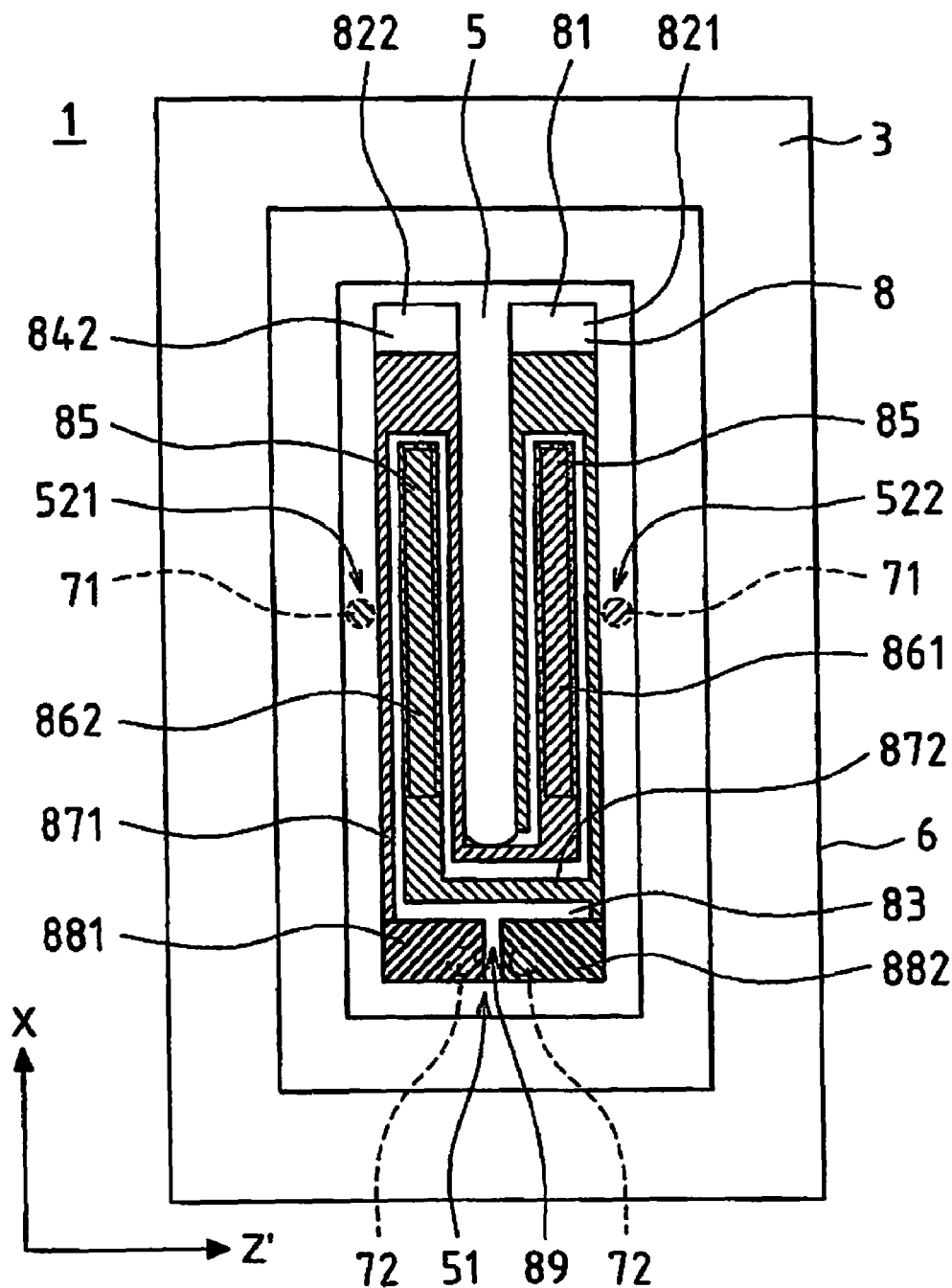
FIG. 8 is a plan view schematically showing an inside of a crystal resonator according to another example of the present invention.

The crystal resonator plate 8 of FIGS. 8 and 9 is formed by etching a crystal strip made of an anisotropic material. A substrate 81 of the crystal resonator plate 8 comprises two leg portions 821 and 822 and a base portion 83. The substrate 81 has an outer circumferential shape of substantially a rectangular parallelepiped. The two leg portions 821 and 822 protrude from the base portion 83. Also, a concave portion 85 is formed in each of both main surfaces 841 and 842 of the two leg portions 821 and 822 so as to improve a series resonance resistance value which is otherwise deteriorated due to miniaturization of the crystal resonator plate 8.

Two excitation electrodes 861 and 862 having different potentials, and extraction electrodes 871 and 872 for electrically and mechanically bonding the excitation electrodes 861 and 862 with electrode pads of a base 3 (not shown), are formed in both the main surfaces 841 and 842 of the crystal resonator plate 8. The extraction electrodes 871 and 872 are extended from the excitation electrodes 861 and 862 to the base portion 83. Extraction tip portions 881 and 882 of the extraction electrodes 871 and 872 formed in the base portion 83 are bonded with the electrode pads of the base 3 via a support member 5 using crystal resonator plate bonding members 72, so that the excitation electrodes 861 and 862 are electrically and mechanically bonded with the electrode pads of the base 3.

The excitation electrodes 861 and 862 and the extraction electrodes 871 and 872 are, for example, a laminated thin film comprising an underlying electrode layer made of chromium and an upper electrode layer made of gold. The thin film is formed on an entire surface by a technique, such as vacuum vapor deposition, sputtering or the like, and thereafter, is formed into a desired shape by metal etching using photolithography. Also, the extraction tip portions 881 and 882 of the extraction electrodes 871 and 872 and a portion close thereto of the extraction electrodes 871 and 872 are, for example, a laminated thin film comprising an underlying electrode layer made of chromium, an intermediate electrode layer made of gold, and an upper electrode layer made of chromium. This thin film is formed on an entire surface by a technique, such as vacuum vapor deposition, sputtering or the like, and thereafter, is formed into a desired shape by metal etching using photolithography, and only the upper electrode layer of chromium is formed by a technique, such as vacuum vapor deposition or the like, using a partial mask. Further, the extraction tip portions 881 and 882 (the extraction tip portions 881 and 882 of FIG. 8 and FIG. 9(*a*)) formed at an opposed position 89 opposed to the extraction tip portions 871 and 872 formed in the main surface 842, of the other main surface 841 of the crystal resonator plate 8, of the extraction tip portions 881 and 882 of the extraction electrodes 871 and 872, have a surface of chromium whose surface is oxidized into an insulating material. Alternatively, a portion of chromium of the surface of the extraction tip portions 881 and 882 is oxidized into an insulating material. The chromium oxide as used here has a higher surface hardness than that of the chromium.

Although materials (chromium, gold, and chromium (Cr—Au—Cu)) for the extraction tip portions 881 and 882 of the extraction electrodes 871 and 872 are laminated in this order and surface chromium is oxidized in the crystal resonator plate 8 of FIG. 9, the present invention is not limited to this. As is similar to the crystal resonator plate of FIG. 2, for example, chromium, gold, and nickel (Cr—Au—Cu) may be laminated in this order and surface nickel may be oxidized. Alternatively, chromium and nickel (Cr—Ni) may be laminated in this order and surface nickel may be oxidized. Alternatively, nickel and chromium (Ni—Cr) may be laminated in this order and surface chromium may be oxidized.

Figure 10:
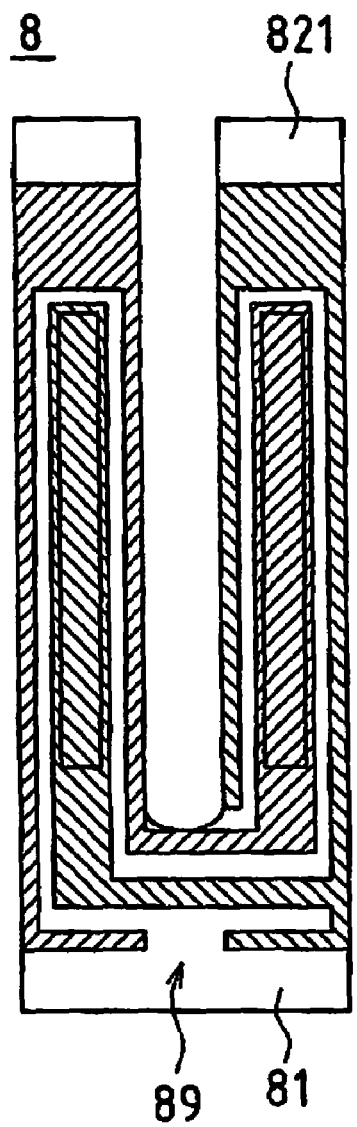
FIG. 10 is a diagram schematically showing a structure of a crystal resonator plate according to another example of the present invention.
Figure 10:
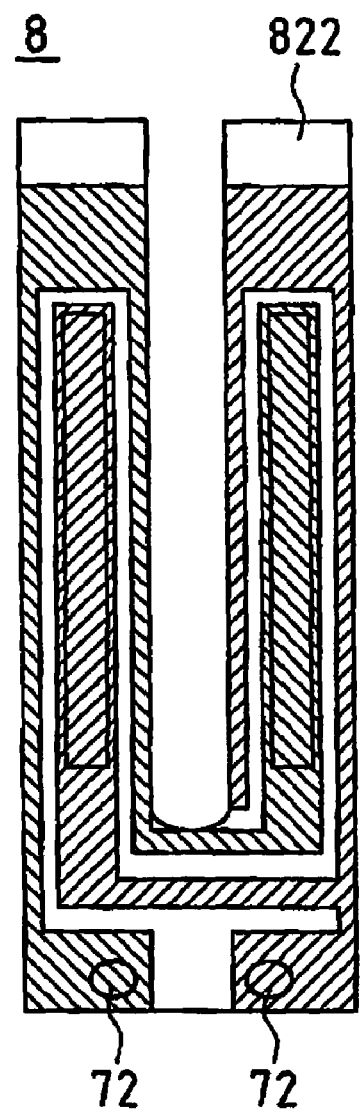

Also, although the surface of chromium in the surface of the extraction tip portions 881 and 882 formed at the opposed position 89 of the crystal resonator plate 8 is oxidized into an insulating material as shown in FIG. 9, the present invention is not limited to this. If it is possible to prevent an electrode whose surface is made of gold from being peeled off and being fixedly attached to the ultrasonic wave emitting member of the FCB apparatus when the crystal resonator plate 8 is bonded with the support member 5 by FCB using ultrasonic waves, the substrate 81 may be exposed at the opposed position 89 of the crystal resonator plate 8 as shown in FIG. 10 (FIGS. 10(*a*) and 10(*b*)), for example. However, as shown in FIG. 10, if the substrate 81 is exposed at the opposed position 89 of the crystal resonator plate 8, image recognition may not be achieved with respect to a location of the crystal resonator plate 8 during a manufacturing step of the crystal resonator 1. This is because a pattern below an exposed portion of the crystal resonator plate 8 may be recognized. Therefore, in the tuning fork crystal resonator plate, covering the opposed position 89 of the substrate 81 with an insulating material as shown in FIG. 9(*a*) is more preferable than exposing the substrate 81 at the above-described opposed position 89. Also, as described above, the extraction tip portions 881 and 882 at the opposed position 89 may have a surface made of chromium instead of an insulating material.

Also, although only connection bumps made of a metal material are used in the crystal resonator 1 of this example, the connection bump is not limited to this. Connection bumps may be made of a non-conductive material. However, even when connection bumps made of a non-conductive material are used, connection bumps made of a conductive material (a metal material in this example) for establishing conduction between the excitation electrodes 231 and 232 of the crystal resonator plate 1 and the electrode pads of the package 6 are also used.

Figure 11:
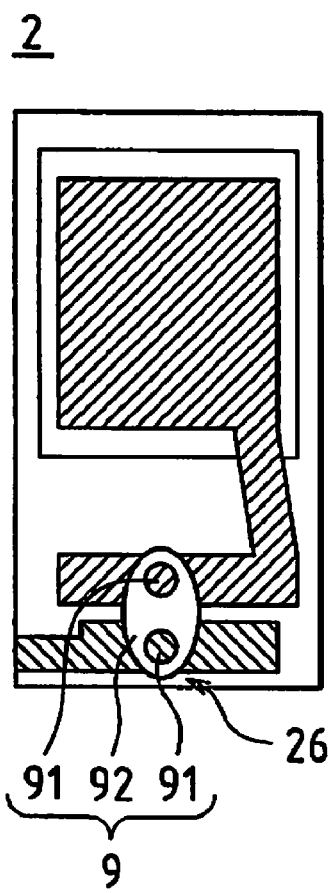
FIG. 11(a) is a plan view schematically showing a variation of the crystal resonator plate of FIG. 2(b).
FIG. 11(b) is a plan view schematically showing a variation of the crystal resonator plate of FIG. 9(b).
Figure 11:
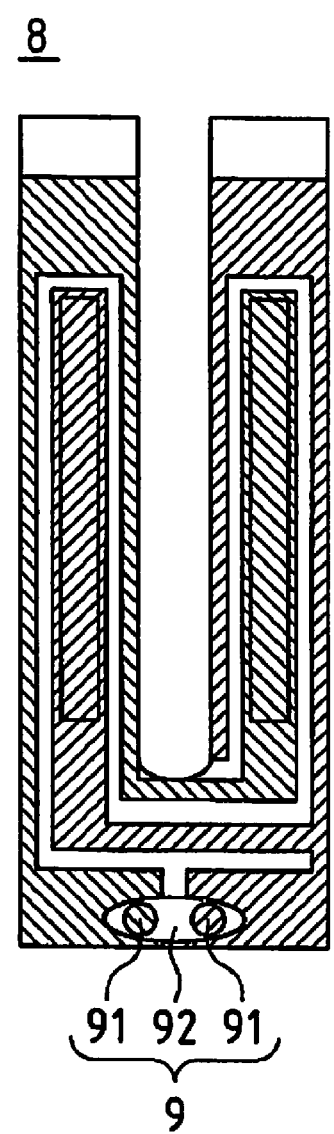

Also, although the support member 5 is bonded with the crystal resonator plate 2 at the two extraction tip portions 251 and 252 in the area 26 of the crystal resonator plate 2 in this example, the present invention is not limited to this. For example, as shown in FIG. 11(*a*), the support member 5 may be bonded with the crystal resonator plate 2 via a single bonding bump 9 in the area 26 of the crystal resonator plate 2. The single bonding bump 9 comprises two conductive portions 91 made of a conductive material and one non-conductive portion 92 made of a non-conductive material. The conductive portion 91 is covered with the non-conductive portion 92. Also, the bonding bump 9 is applicable not only to the thickness-shear vibration crystal resonator plate 2 of FIG. 11(*a*), but also to a tuning fork the crystal resonator plate 8 shown in FIG. 11(*b*). In this case, the occurrence of external stress to the crystal resonator plates 1 and 8 due to the above-described two-point bonding is preferably suppressed.

The above-described connection bump may be previously formed either on the crystal resonator plate or on the substrate (or the support member). Note that, when the connection bump is previously formed on the substrate (or the support member), it is possible to reduce mechanical stress load to the crystal resonator plate.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority on Patent Application No. 2005-368524 filed in Japan on Dec. 21, 2005 and Patent Application No. 2006-238093 filed in Japan on Sep. 1, 2006, which are hereby incorporated by reference in their entirety.

INDUSTRIAL APPLICABILITY

The present invention is applicable to a piezoelectric resonator, such as a crystal resonator or the like.

The invention claimed is:

1. A piezoelectric resonator device comprising:
   a piezoelectric resonator plate, wherein
   at least one excitation electrode is formed in each of both main surfaces of a substrate, and a plurality of extraction electrodes are formed by extending the excitation electrodes so as to electrically and mechanically bond the excitation electrodes with external electrodes,
   extraction tip portions of the plurality of extraction electrodes are extended to solely a vicinity of one side portion of one of the main surfaces, and external electrodes are electrically and mechanically bonded with the respective extraction tip portions of the plurality of extraction electrodes, and
   the substrate is exposed at a position of the other main surface of the substrate, the position being opposed to the extraction tip portions formed on the one main surface.

2. The piezoelectric resonator device according to claim 1, wherein
   the piezoelectric resonator plate is a tuning-fork type piezoelectric resonator plate.

* * * * *